(12) United States Patent
Suvanto

(10) Patent No.: US 10,017,377 B2
(45) Date of Patent: Jul. 10, 2018

(54) PROTECTIVE COATING ON TRENCH FEATURES OF A WAFER AND METHOD OF FABRICATION THEREOF

(71) Applicants: Akustica, Inc., Pittsburgh, PA (US); Robert Bosch GmbH, Stuttgart (DE)

(72) Inventor: Mikko VA Suvanto, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/196,395

(22) Filed: Jun. 29, 2016

(65) Prior Publication Data
US 2018/0002165 A1 Jan. 4, 2018

(51) Int. Cl.
| | | |
|---|---|---|
| *B81B 7/00* | (2006.01) | |
| *B81C 1/00* | (2006.01) | |
| *H01L 23/00* | (2006.01) | |

(52) U.S. Cl.
CPC ........ *B81B 7/0058* (2013.01); *B81C 1/00825* (2013.01); *H01L 23/562* (2013.01); *B81B 2203/033* (2013.01); *B81C 1/00404* (2013.01); *B81C 2201/053* (2013.01)

(58) Field of Classification Search
CPC ......... H01L 21/76254; H01L 21/76259; H01L 438/46; H01L 21/304; H01L 21/78; H01L 2221/68327; H01L 33/0095; H01L 438/462; H01L 21/3043; H01L 438/464; H01L 2221/68331; H01L 2221/68336; H01L 438/465; H01L 257/632; H01L 21/76801
See application file for complete search history.

(56) References Cited

U.S. PATENT DOCUMENTS

| | | | | |
|---|---|---|---|---|
| 6,335,224 B1* | 1/2002 | Peterson | ............. | B81C 1/00333 257/E21.502 |
| 8,236,611 B1* | 8/2012 | Anderson | ............... | H01L 21/78 257/E21.483 |
| 2006/0024949 A1* | 2/2006 | Yamada | .................. | H01L 21/78 438/622 |

(Continued)

*Primary Examiner* — Sonya D McCall Shepard
(74) *Attorney, Agent, or Firm* — Maginot Moore & Beck LLP (57) ABSTRACT

A coating for protecting a wafer from moisture and debris due to dicing, singulating, or handling the wafer is provided. A semiconductor sensor device comprises a wafer having a surface and at least one trench feature and the protective coating covering the trench feature. The trench feature comprises a plurality of walls and the walls are covered with the protective coating, wherein the walls of the trench feature are formed as a portion of the semiconductor sensor device. The semiconductor sensor device further comprises a patterned mask formed on the wafer before the trench feature is formed, wherein the protective coating is formed directly to the trench feature and the patterned mask. The semiconductor sensor device is selected from a group consisting of a MEMS die, a sensor die, a sensor circuit die, a circuit die, a pressure die, an accelerometer, a gyroscope, a microphone, a speaker, a transducer, an optical sensor, a gas sensor, a bolometer, a giant magnetoresistive sensor (GMR), a tunnel magnetoresistive (TMR) sensor, an environmental sensor, and a temperature sensor.

15 Claims, 9 Drawing Sheets

(56) References Cited

U.S. PATENT DOCUMENTS

| | | | | |
|---|---|---|---|---|
| 2007/0115530 A1* | 5/2007 | Chen | ................. | B81B 3/0005 |
| | | | | 359/290 |
| 2012/0267780 A1* | 10/2012 | Chen | ................. | H01L 21/78 |
| | | | | 257/737 |
| 2016/0369131 A1* | 12/2016 | Lim | ................. | G02B 5/003 |

* cited by examiner

PROTECTIVE COATING ON TRENCH FEATURES OF A WAFER AND METHOD OF FABRICATION THEREOF

FIELD

This disclosure generally relates Microelectromechanical System (MEMS) wafer, and more particularly, to protecting a wafer having trench features during fabrication and handling process of the wafer.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to systems and methods of protecting a wafer from moisture and debris due to dicing, singulating, or handling the wafer. The method comprises forming at least one trench feature on the wafer, applying a protective coating to the trench feature, and dicing along the trench feature into at least one die, wherein the protective coating is a hydrophobic self-assembled monolayer (SAM). The trench feature comprises a plurality of walls and the walls are covered with the protective coating. At least one wall of the trench feature formed as a body portion of the die. The method further comprises applying a patterned mask on the wafer before forming the trench feature, wherein the protective coating is applied directly to at least one of the trench feature or the patterned mask.

In another embodiment of the disclosure, the method further comprises removing the patterned mask after the trench feature is formed and the protecting coating is directly applied to the wafer and the trench feature. The die is selected from a group consisting of a MEMS die, a sensor die, a sensor circuit die, a circuit die, a pressure die, an accelerometer, a gyroscope, a microphone, a speaker, a transducer, an optical sensor, a gas sensor, a bolometer, a giant magnetoresistive sensor (GMR), a tunnel magnetoresistive (TMR) sensor, an environmental sensor, a temperature sensor, and a semiconductor die.

In yet another embodiment of the disclosure, a semiconductor sensor device comprises a wafer having a surface and at least one trench feature and a protective coating covering the trench feature, wherein the protective coating is a hydrophobic self-assembled monolayer (SAM). The trench feature comprises a plurality of walls and the walls are covered with the protective coating, wherein the walls of the trench feature are formed as a portion of the semiconductor sensor device. The semiconductor sensor device further comprises a patterned mask formed on the wafer before the trench feature is formed, wherein the protective coating is formed directly to the trench feature and the patterned mask. The semiconductor sensor device is selected from a group consisting of a MEMS die, a sensor die, a sensor circuit die, a circuit die, a pressure die, an accelerometer, a gyroscope, a microphone, a speaker, a transducer, an optical sensor, a gas sensor, a bolometer, a giant magnetoresistive sensor (GMR), a tunnel magnetoresistive (TMR) sensor, an environmental sensor, and a temperature sensor.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
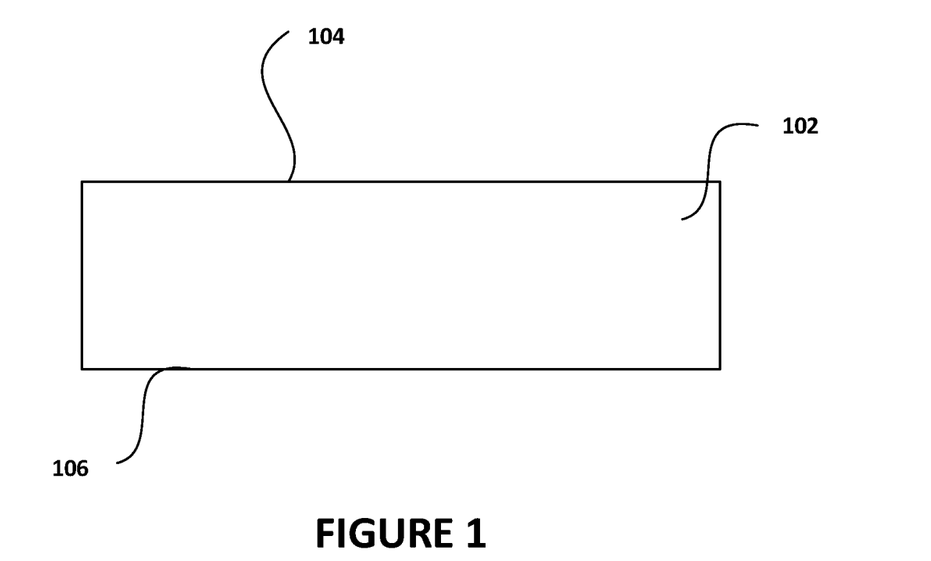
FIG. 1 is a schematic cress-sectional view of a wafer according to a described embodiment of the disclosure.
Figure 2:
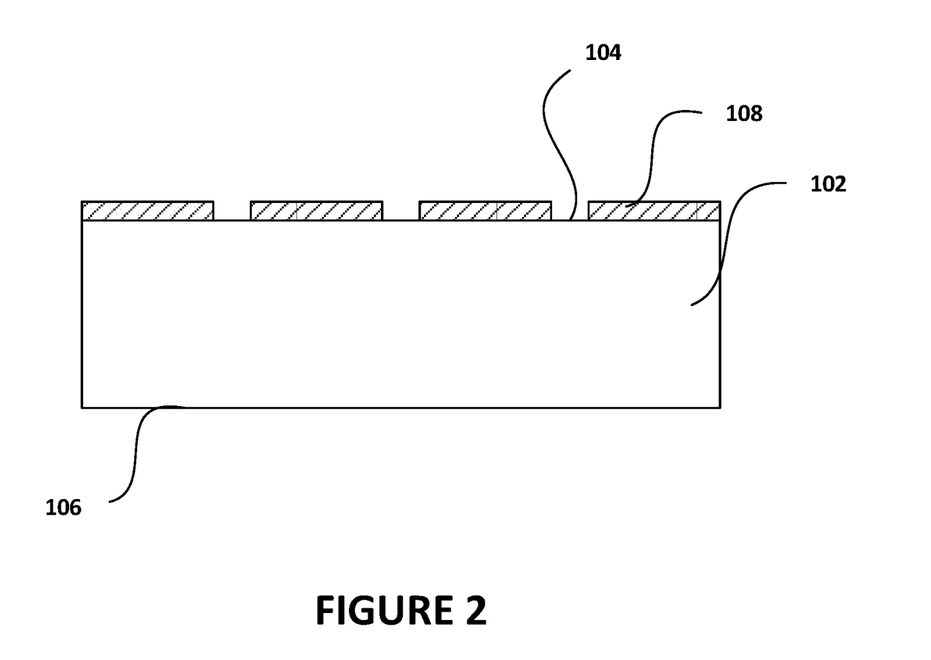
FIG. 2 is a schematic cross-sectional view of the wafer of FIG. 1 having a patterned mask applied on the wafer according to a described embodiment of the disclosure.
Figure 3:
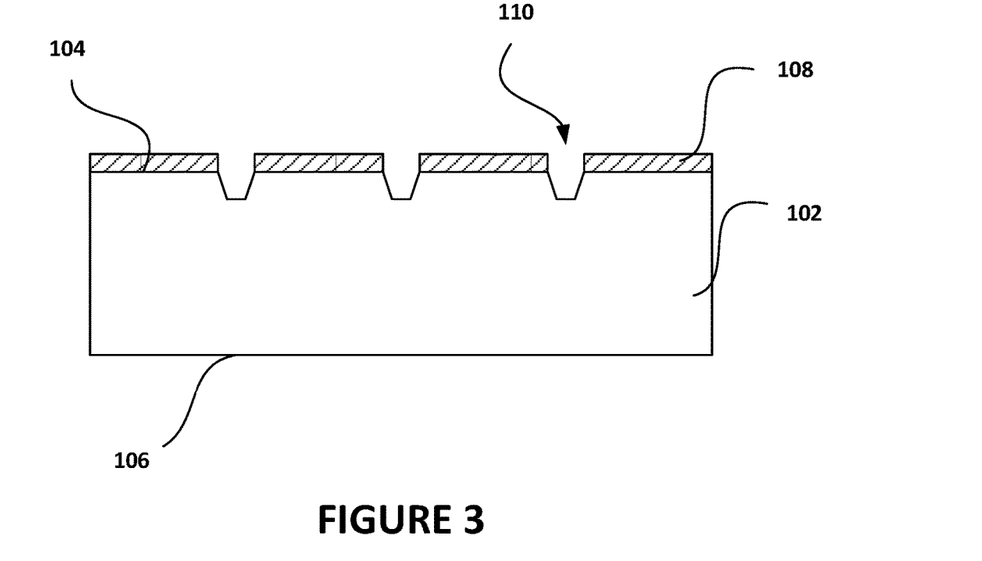
FIG. 3 is a schematic cross-sectional view of the wafer of FIG. 2 including one or more trench features formed on exposed regions located between surfaces covered with the patterned mask according to a described embodiment of the disclosure.
Figure 4:
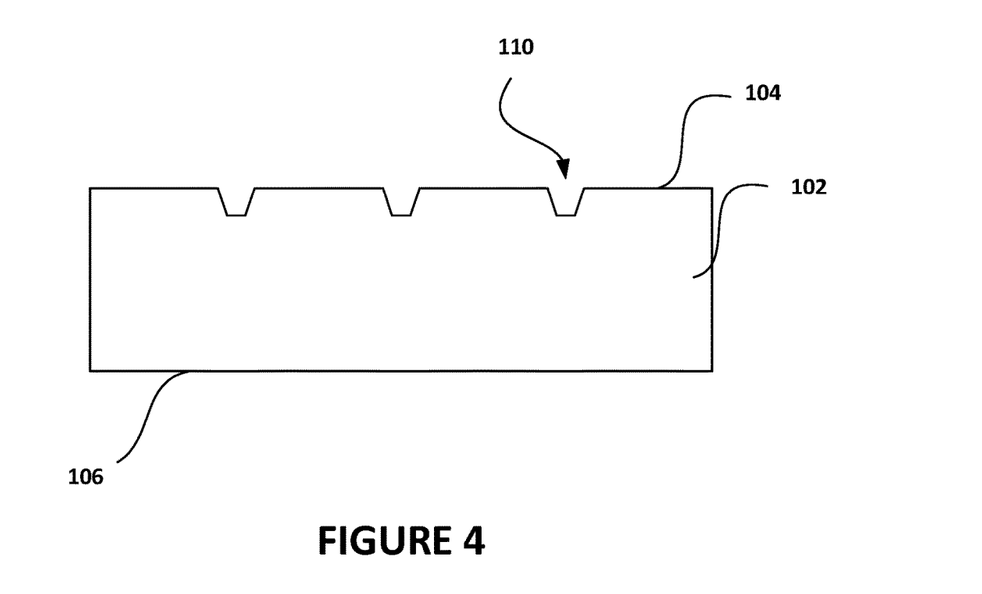
FIG. 4 is a schematic cross-sectional view of the wafer of FIG. 3 after the mask is removed according to a described embodiment of the disclosure.
Figure 5:
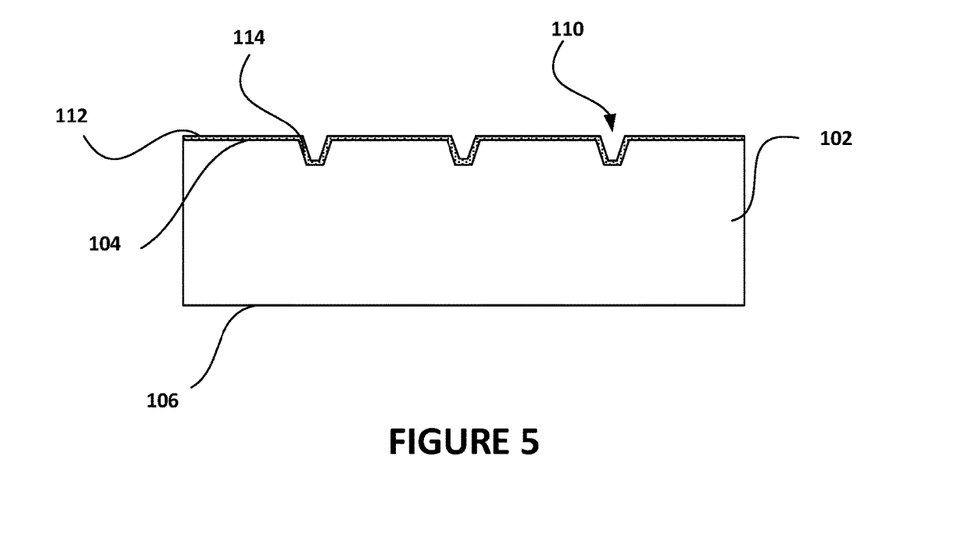
FIG. 5 is a schematic cross-sectional view of the wafer of FIG. 4 covered with monolayer coating according to a described embodiment of the disclosure.
Figure 6:
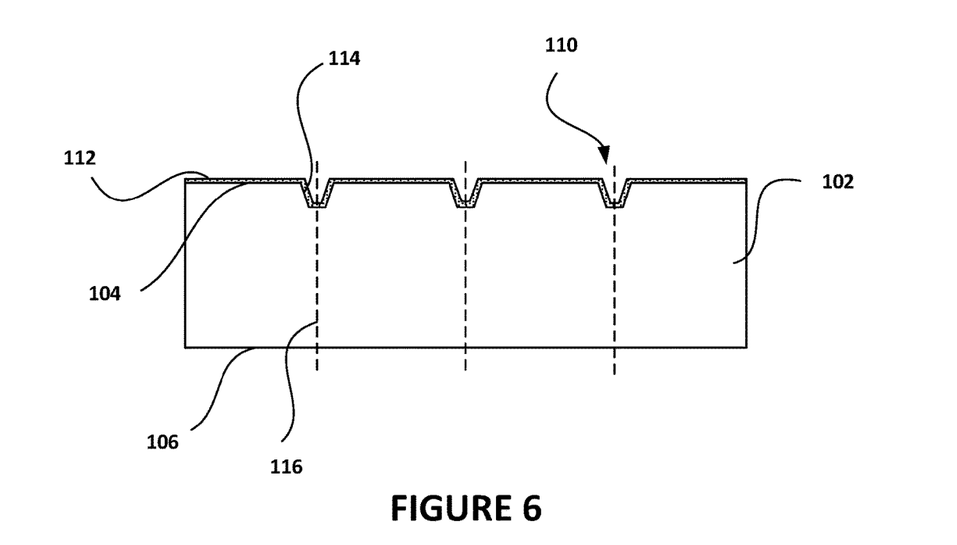
FIG. 6 is a schematic cross-sectional view of the wafer of FIG. 5 including one or more scribes located on the trench features for performing dicing or singulating process.
Figure 7A:
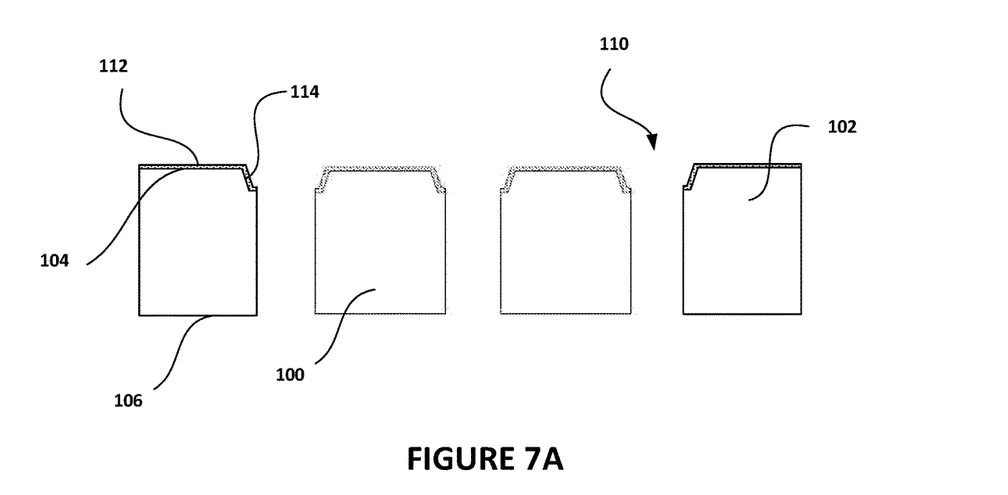
FIGS. 7A-7C are schematic cross-sectional views of the wafer of FIG. 6 singulated into a plurality of MEMS dies either with or without monolayer coating according to a described embodiment of the disclosure.
Figure 7B:
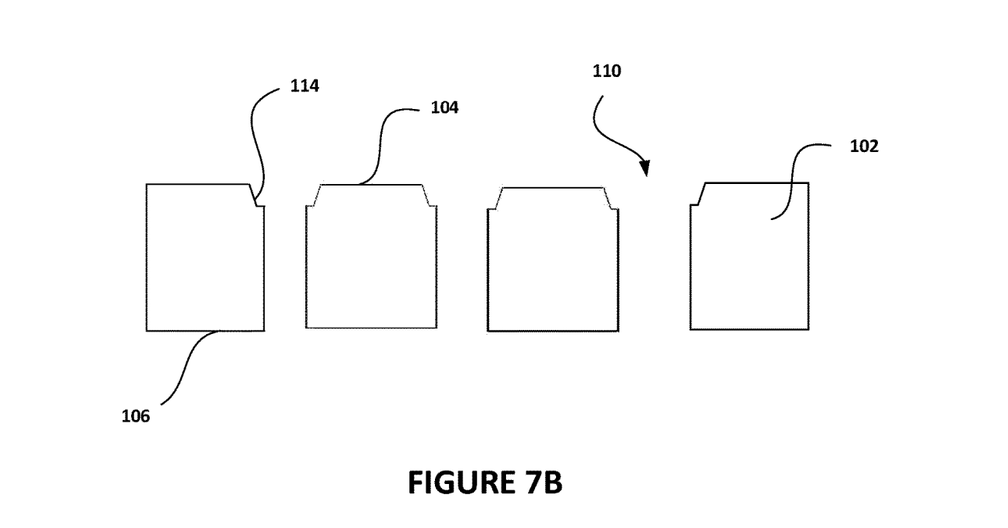
Figure 7C:
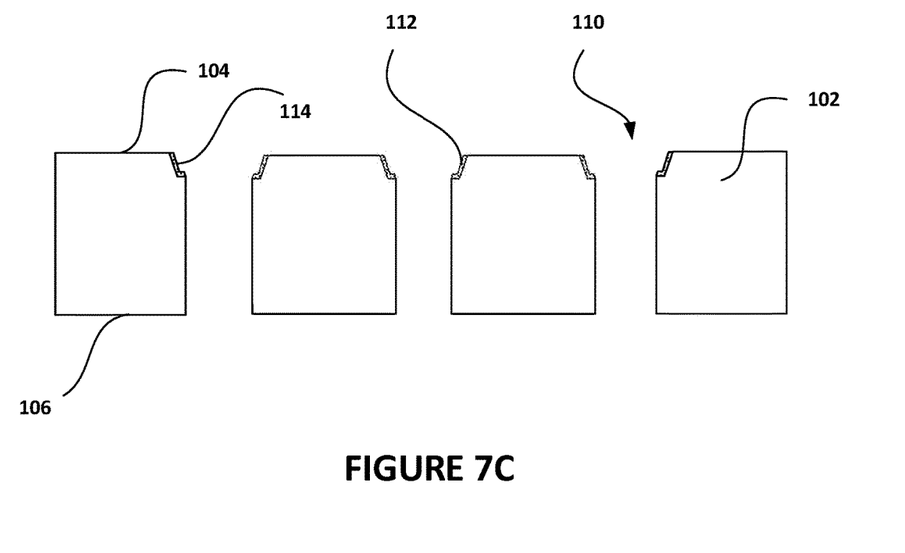
Figure 8:
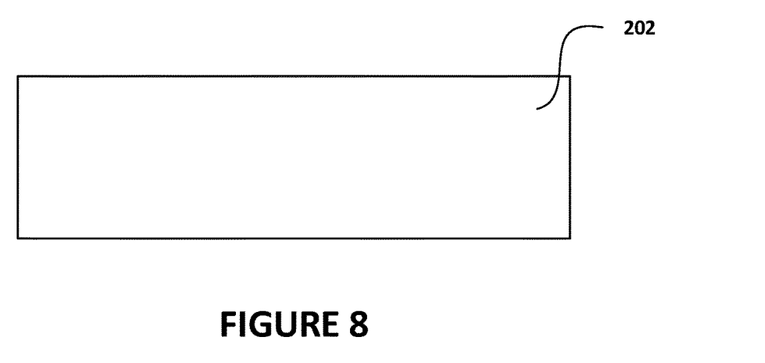
FIG. 8 is a schematic cress-sectional view of a wafer according to another described embodiment of the disclosure.
Figure 9:
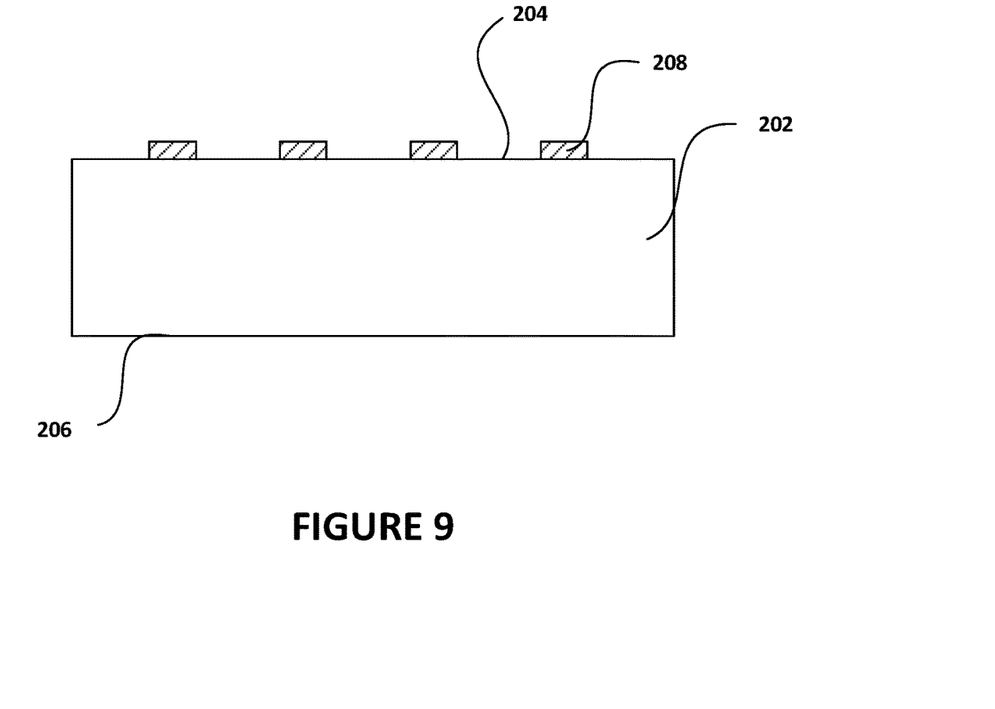
FIG. 9 is a schematic cross-sectional view of the wafer of FIG. 8 having a patterned mask applied on the wafer according to another described embodiment of the disclosure.

FIGS. 1-7 illustrate schematic cross-sectional views of exemplary systems and methods of protecting a plurality of die such as semiconductor sensor devices 100 from moisture and debris due to dicing, singulating, or handling a wafer 102 according to an embodiment of a disclosure. The wafer 102 in any suitable thickness comprises a first surface 104 and a second surface 106. In one embodiment, the surfaces 104, 106 may be a sensing or circuit surface and/or a non-sensing or non-circuit surface 106. In some embodiments, a portion of the surfaces 104, 106 includes a sensing or circuit surface. In another embodiment, the entire second surface 106 may include sensing or circuit surface identical to the surface 104. As illustrated, the first surface 104 is a sensing or circuit surface and the second surface 106 is a non-sensing or non-circuit surface. The wafer 102 may be formed from any suitable materials, depending on the application. As an example, the wafer 102 may be formed form silicon material. A first coating or film 108, which includes any suitable pattern, is applied to the sensing or circuit surface, first surface 104 is illustrated by any suitable method. As depicted on FIG. 2, a certain portion of the first surface 104 is covered with the first coating or film 108 while a remaining portion of the first surface 104 that is not covered by the first patterned film 108 exposes for forming at least one trench feature. The first coating or film 108 applied to the first 104 includes a desired thickness and suitable material. A plurality of trenches 110 is formed on the exposed first surface 104 by any suitable etching technique, as depicted in FIG. 3. The trenches 110 comprises a plurality of walls, side and bottom walls are illustrated, 114 and the walls are covered with the protective coating, wherein the walls of the trench feature are formed as a portion of the semiconductor sensor device. The patterned film 108 is removed thereafter to expose the rest of the first surface 104, as shown in FIG. 4. A protective coating formed from hydrophobic self-assembled monolayer (SAM) material 112 is applied and covered the entire surface of the first surface 104 and the trenches 110 as shown in FIG. 5. The SAM protective coating 112 may have any suitable thickness for protecting the die 100 from moisture and debris due to dicing, singulating, or handling the wafer. In one embodiment, as illustrated in FIG. 6, a dicing operation may be performed along, for example, lines 116. Once singulation has been performed, a plurality of individual die 100 is formed as depicted in FIGS. 7A-7C. The protective coating 112, in one embodiment, may be left on the first surface 104 and walls 114 of the trenches 110 to protect the dies during handling operation. In another embodiment, as depicted in FIG. 7B, the protective coating 112 is completely during before or after the handling operation. In yet another embodiment, partial protective coating 112 is removed from the first surface 104 whereas the remaining portion of the protective coating 112 is left on the walls 114 of the trenches 110 for protecting the die during handling operation. The semiconductor sensor device is selected from a group consisting of a MEMS die, a sensor die, a sensor circuit die, a circuit die, a pressure die, an accelerometer, a gyroscope, a microphone, a speaker, a transducer, an optical sensor, a gas sensor, a bolometer, a giant magnetoresistive sensor (GMR), a tunnel magnetoresistive (TMR) sensor, an environmental sensor, and a temperature sensor.

Figure 10:
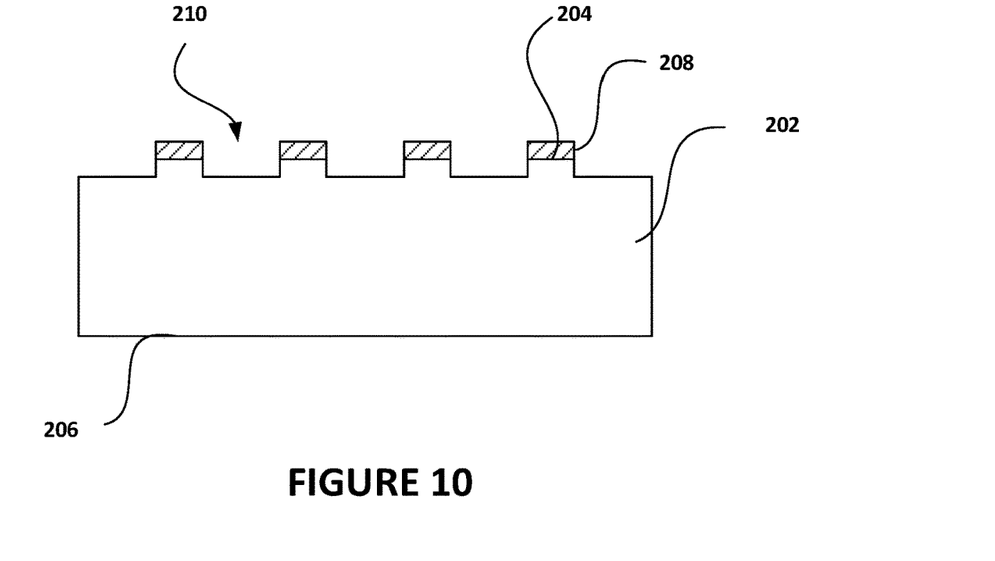
FIG. 10 is a schematic cross-sectional view of the wafer of FIG. 9 including one or more trench features formed on exposed regions located between surfaces covered with the patterned mask according to another described embodiment of the disclosure.
Figure 11:
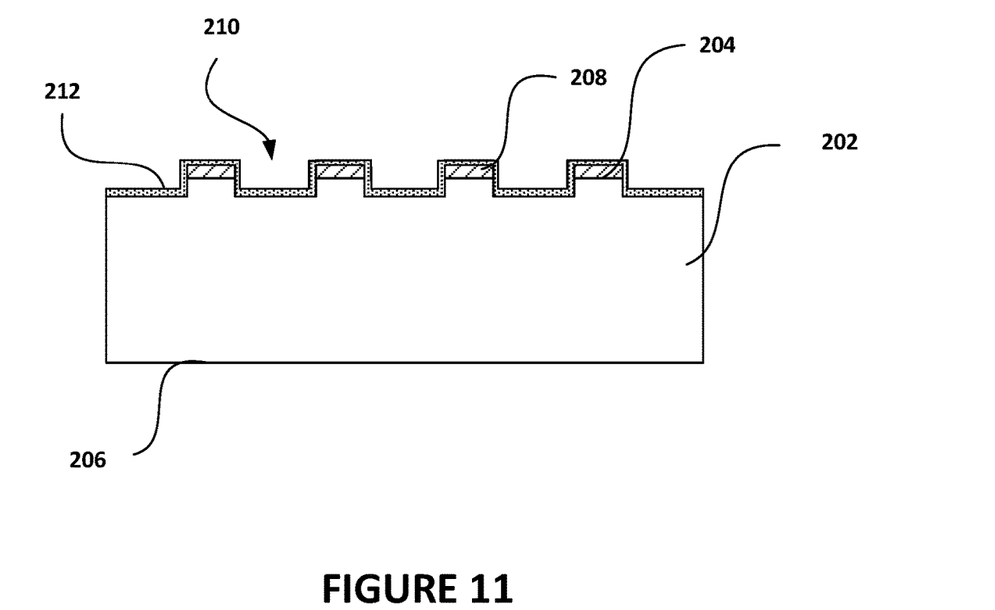
FIG. 11 is a schematic cross-sectional view of the wafer of FIG. 10 covered with monolayer coating according to another described embodiment of the disclosure.
Figure 12:
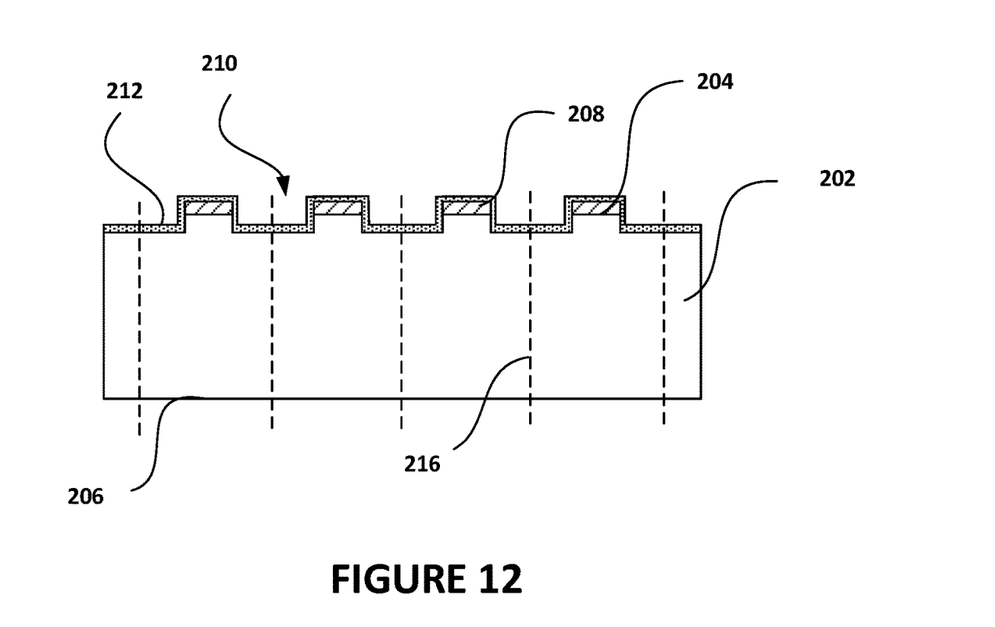
FIG. 12 is a schematic cross-sectional view of the wafer of FIG. 11 including one or more scribes located on the trench features for performing dicing or singulating process.
Figure 13A:
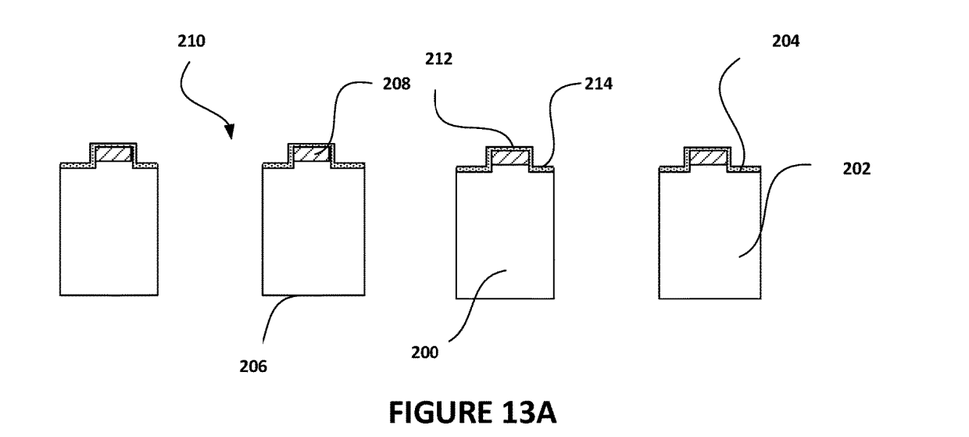
FIGS. 13A-13C are schematic cross-sectional views of the wafer of FIG. 13 singulated into a plurality of MEMS dies either with or without monolayer coating according to a described embodiment of the disclosure.
Figure 13B:
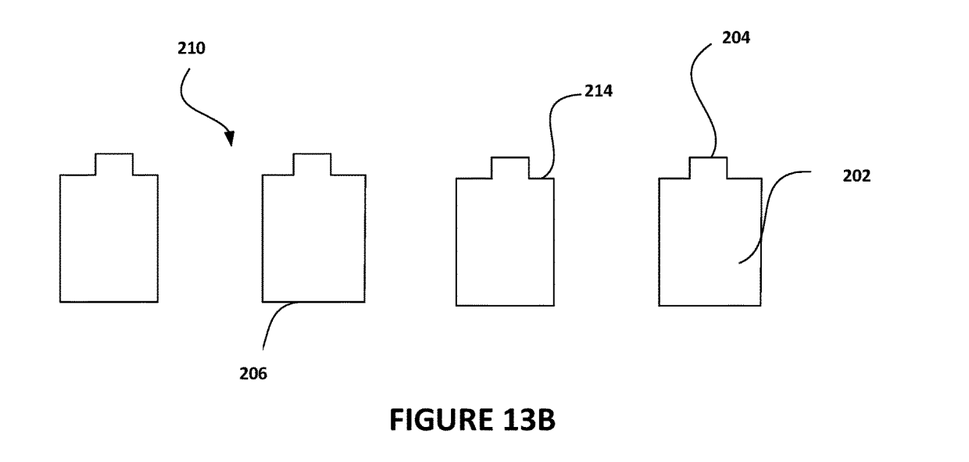
Figure 13C:
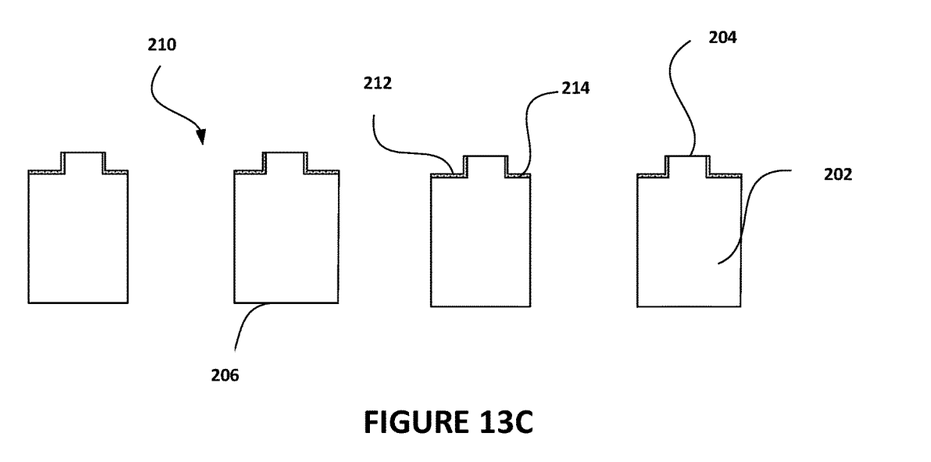

FIGS. 8-13 illustrate schematic cross-sectional views of another exemplary systems and methods of protecting a plurality of die such as semiconductor sensor devices 200 from moisture and debris due to dicing, singulating, or handling a wafer 102 according to an embodiment of a disclosure. The wafer 202 in any suitable thickness comprises a first surface 204 and a second surface 206. In one embodiment, the surfaces 204, 206 may be a sensing or circuit surface and/or a non-sensing or non-circuit surface 206. In some embodiments, a portion of the surfaces 204, 206 includes a sensing or circuit surface. In another embodiment, the entire second surface 206 may include sensing or circuit surface identical to the first surface 204. As illustrated, the first surface 204 is a sensing or circuit surface and the second surface 206 is a non-sensing or non-circuit surface. The wafer 202 may be formed from any suitable materials, depending on the application. As an example, the wafer 202 may be formed form silicon material. A first coating or film 208, which includes any suitable pattern, is applied to the sensing or circuit surface, first surface 204 is illustrated by any suitable method. As depicted on FIG. 9, a certain portion of the first surface 204 is covered with the first coating or film 208 while a remaining portion of the first surface 204 that is not covered by the first patterned film 208 exposes for forming at least one trench feature. The first coating or film 208 applied to the first 204 includes a desired thickness and suitable material. A plurality of trenches 210 is formed on the exposed first surface 204 by any suitable etching technique, as depicted in FIG. 10. The trenches 110 comprises a plurality of walls, side and bottom walls are illustrated. Unlike from previous embodiment as depicted in FIGS. 1-7, the patterned film 208 is left in place on the first surface 204 of the wafer 202. A protecting coating formed from hydrophobic self-assembled monolayer (SAM) material 212 is applied and covered over the patterned film 208 and the trenches 210 as shown in FIG. 11. The SAM protective coating 212 may have any suitable thickness for protecting the die 200 from moisture and debris due to dicing, singulating, or handling the wafer. In one embodiment, as illustrated in FIG. 12, a dicing operation may be performed along, for example, lines 216. Once singulation has been performed, a plurality of individual die 100 is formed as depicted in FIGS. 13A-13C. The protective coating 212, in one embodiment, may be left on the patterned film 208 and the walls 214 of the trenches 210 to protect the dies during handling operation. In another embodiment, as depicted in FIG. 13B, the protective coating 212 and the patterned film 208 are completely during before or after the handling operation. In yet another embodiment, entire patterned film 208 and partial protective coating 212 are removed from the first surface 204 whereas the remaining portion of the protective coating 212 is left on the walls 214 of the trenches 210 for protecting the die during handling operation. The semiconductor sensor device is selected from a group consisting of a MEMS die, a sensor die, a sensor circuit die, a circuit die, a pressure die, an accelerometer, a gyroscope, a microphone, a speaker, a transducer, an optical sensor, a gas sensor, a bolometer, a giant magnetoresistive sensor (GMR), a tunnel magnetoresistive (TMR) sensor, an environmental sensor, and a temperature sensor.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

While the patent has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments.

Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A method of protecting a wafer from moisture and debris due to dicing, singulating, or handling the wafer, comprising:
    forming at least one trench feature on the wafer by etching an upper surface of the wafer;
    applying a protective coating on the trench feature; and
    dicing the wafer through the protective coating on the trench feature into a plurality of die;
    wherein the protective coating is a hydrophobic self-assembled monolayer (SAM).

2. The method of claim 1, wherein the trench feature comprises at least one side wall and applying the protective coating comprises:
    coating the at least one side wall with the protective coating.

3. The method of claim 2, wherein the at least one side wall is formed as a portion of the die.

4. The method of claim 3, further comprising applying a patterned mask on the wafer before forming the trench feature.

5. The method of claim 4, wherein the protective coating is applied directly to the trench feature and the patterned mask.

6. The method of claim 1, wherein the die is selected from a group consisting of a MEMS die, a sensor die, a sensor circuit die, a circuit die, a pressure die, an accelerometer, a gyroscope, a microphone, a speaker, a transducer, an optical sensor, a gas sensor, a bolometer, a giant magnetoresistive sensor (GMR), a tunnel magnetoresistive (TMR) sensor, an environmental sensor, a temperature sensor, and a semiconductor die.

7. The method of claim 4, further comprising removing the patterned mask after the trench feature is formed.

8. The method of claim 7, wherein the protective coating is directly applied to the wafer upper surface and the trench feature.

9. A semiconductor sensor device comprising:
    a wafer having an outer surface and at least one trench feature etched into the wafer from the outer surface; and
    a protective coating covering the trench feature;
    wherein the protective coating is a hydrophobic self-assembled monolayer (SAM).

10. The semiconductor sensor device of claim 9 wherein the trench feature comprises at least one side wall and the at least one side wall is coated with the protective coating.

11. The semiconductor sensor device of claim 10 wherein the at least one side wall is formed as a portion of the semiconductor sensor device.

12. The semiconductor sensor device of claim 11, further comprising a patterned mask formed on the wafer before the trench feature is formed.

13. The semiconductor sensor device of claim 12, wherein the protective coating is formed directly on the trench feature and the patterned mask.

14. The semiconductor sensor device of claim 13, wherein the semiconductor sensor device is selected from a group consisting of a MEMS die, a sensor die, a sensor circuit die, a circuit die, a pressure die, an accelerometer, a gyroscope, a microphone, a speaker, a transducer, an optical sensor, a gas sensor, a bolometer, a giant magnetoresistive sensor (GMR), a tunnel magnetoresistive (TMR) sensor, an environmental sensor, a temperature sensor, and a semiconductor die.

15. The semiconductor sensor device of claim 12, wherein the protective coating is directly formed on the wafer and the trench feature.

* * * * *